(12) United States Patent
Garratt (10) Patent No.: US 8,209,466 B2
(45) Date of Patent: Jun. 26, 2012

(54) METHODS AND SYSTEMS TO ALLOCATE ADDRESSES IN A HIGH-ENDURANCE/LOW-ENDURANCE HYBRID FLASH MEMORY

(75) Inventor: Jason Garratt, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 723 days.

(21) Appl. No.: 12/336,217

(22) Filed: Dec. 16, 2008

(65) Prior Publication Data
US 2010/0153616 A1 Jun. 17, 2010

(51) Int. Cl.
*G06F 12/00* (2006.01)
(52) U.S. Cl. .............. 711/103; 711/154; 711/E12.001
(58) Field of Classification Search .......... None
See application file for complete search history.

(56) References Cited

U.S. PATENT DOCUMENTS

| | | | |
|---|---|---|---|
| 6,850,443 B2 | 2/2005 | Lofgren et al. | |
| 2007/0061502 A1* | 3/2007 | Lasser et al. | 711/103 |
| 2008/0209112 A1* | 8/2008 | Yu et al. | 711/103 |
| 2008/0209114 A1* | 8/2008 | Chow et al. | 711/103 |
| 2008/0215800 A1* | 9/2008 | Lee et al. | 711/103 |

* cited by examiner

*Primary Examiner* — Kevin Ellis
*Assistant Examiner* — Arvind Talukdar
(74) *Attorney, Agent, or Firm* — Garrett IP, LLC (57) ABSTRACT

Methods and systems to selectively map higher-usage addresses to higher-endurance memory cells of a flash memory, and lower-usage addresses to lower-endurance memory cells of the flash memory. Address usage may be determined with respect to the most recent write operation corresponding to an address and/or with respect to a frequency of write operations corresponding to the address. Higher-endurance memory cells may include single level cells (SLCs). Lower-endurance memory cells may include multi-level cells (MLCs). Improved endurance may be obtained with a relatively small percentage of higher-endurance memory cells, at a relatively low cost.

20 Claims, 5 Drawing Sheets

METHODS AND SYSTEMS TO ALLOCATE ADDRESSES IN A HIGH-ENDURANCE/LOW-ENDURANCE HYBRID FLASH MEMORY

BACKGROUND

Flash memory is a type of non-volatile, electrically erasable programmable read-only memory (EEPROM), which is erased and programmed on a page or block basis.

Flash memory may include NAND type cells or NOR type cells. NAND type flash memory provides reading, unlocking, erasing, and writing to pages or blocks of memory cells. NOR type flash memory provides unlocking, erasing, and writing on pages or blocks of memory cells, and may provide reading on individual bytes or words of memory cells.

Flash memory has a finite number of erase/rewrite cycles, referred to as erase-endurance or endurance. Flash memory devices may provide wear leveling, using firmware or file system drivers to count write operations and to dynamically remap blocks of memory in order to spread the write operations among sectors.

Endurances vary between different types of memory cells. For example, flash memory may utilize either single-level cells (SLCs), which store one bit of information per cell, or multi-level cells (MLCs), which store multiple bits of information per cell. Endurance of a single level cell may be an order of magnitude greater than a two-level cell, which may be an order of magnitude greater than a three-level cell. SLC flash memory systems tend to be more expensive than MLC flash memory systems.

BRIEF DESCRIPTION OF THE DRAWINGS/FIGURES

In the drawings, the leftmost digit(s) of a reference number identifies the drawing in which the reference number first appears.

DETAILED DESCRIPTION

Disclosed herein are methods of selectively allocating or mapping addresses amongst higher-endurance memory cells and lower-endurance memory cells to manage the endurances. Also disclosed herein are hybrid flash memory systems having higher-endurance memory cells and lower-endurance memory cells.

Figure 1:
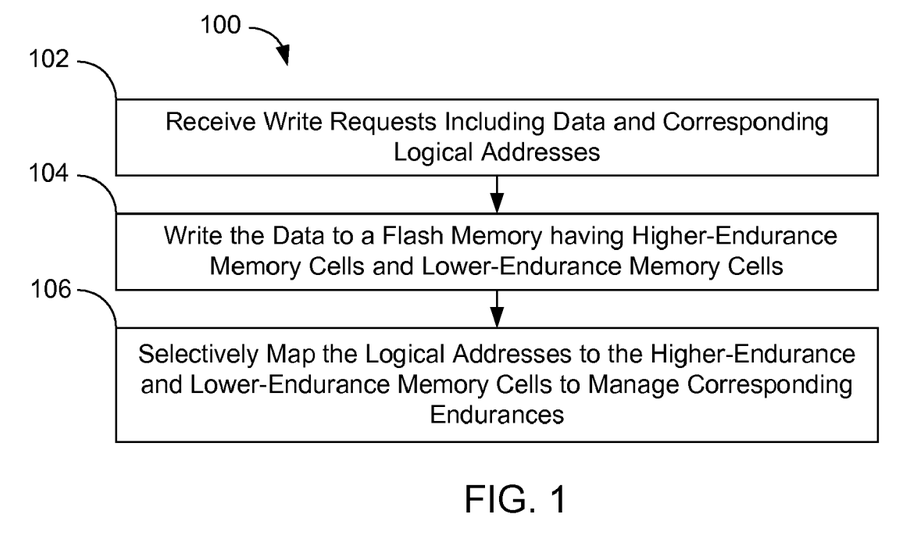
FIG. 1 is a process flowchart of an exemplary method of managing a hybrid flash memory having higher-endurance memory cells and lower-endurance memory cells.

FIG. 1 is a process flowchart of an exemplary method 100 of managing a flash memory having higher-endurance memory cells and lower-endurance memory cells. Method 100 is described below with reference to an exemplary flash memory system 200 illustrated in FIG. 2. Method 100 is not, however, limited to the example of FIG. 2.

At 102, write requests, including data and corresponding logical addresses are received from a host process or host system.

At 104, the data is written to a flash memory having higher-endurance memory cells and lower-endurance memory cells.

Figure 2:
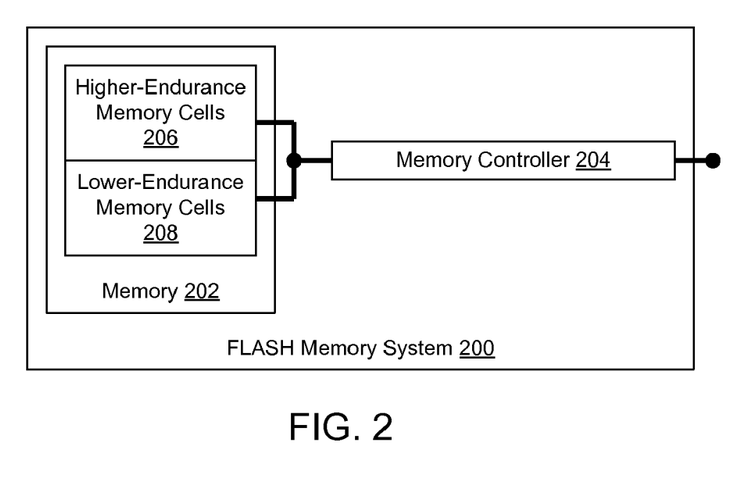
FIG. 2 is a block diagram of an exemplary hybrid flash memory system including higher-endurance memory cells and lower-endurance memory cells.

In FIG. 2, flash memory system 200 includes memory 202 and a memory management unit or memory controller 204. Memory 202 includes higher-endurance memory cells 206 and lower-endurance memory cells 208.

Memory 202 may include one or more arrays of floating-gate transistor-based memory cells, which may be configured as one or more of NAND memory cells and NOR memory cells.

Memory controller 204 is configured to map between host logical addresses and physical addresses of memory 202.

Memory controller 204 may be configured to access memory 202 in pages and/or blocks, wherein each block includes one or more pages. Pages may be, for example, 512, 2,048 or 4,096 bytes in size. Writing may be performed on a page basis, and erasing may be performed on a block basis.

Memory controller 204 or an associated device driver may be configured to perform one or more of bad block management (BBM) and conventional wear leveling with respect to memory 202, or portions thereof.

Higher-endurance memory cells 206 and lower endurance memory cells 208 may have different storage capacities. For example, higher-endurance memory cells 206 may have fewer storage levels than lower endurance memory cells 208. Higher-endurance memory cells 206 may include single-level cells (SLCs), and lower endurance memory cells 208 may include multi-level cells (MLCs). Alternatively, higher-endurance memory cells 206 may include MLCs, such as two-level cells, and lower endurance memory cells 208 may include MLCs having more than two-levels, such as three-levels. Memory 202 may include additional types of memory cells having additional endurance and/or storage levels.

Returning to FIG. 1, at 106, the writing includes selectively mapping the logical addresses to the higher-endurance and lower-endurance memory cells to manage the endurances of the memory cells.

Figure 3:
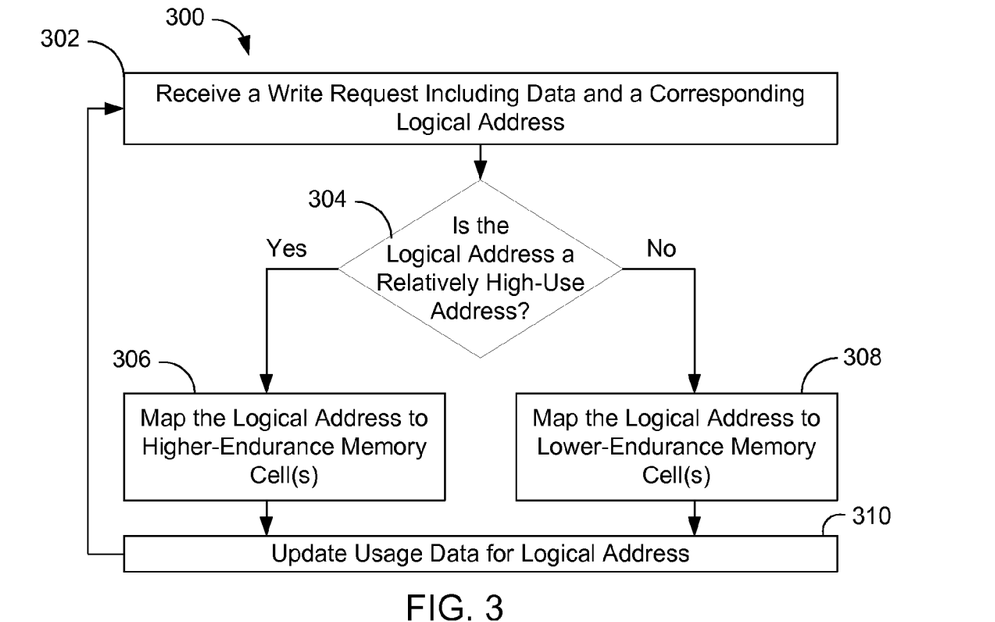
FIG. 3 is a process flowchart of an exemplary method of mapping higher-usage addresses to higher-endurance memory cells, and lower-usage addresses to lower-endurance memory cells.

The selective mapping at 106 may include mapping based on prior usage of the logical addresses. FIG. 3 is a process flowchart of an exemplary method 300 of mapping higher-usage logical addresses to the higher-endurance memory cells, and lower-usage logical addresses to lower-endurance memory cells.

At 302, a write request is received, including data and a corresponding logical address.

At 304, a determination is made as to whether the logical address is a relatively high-use address. The determination may include retrieving a value from a table or other data structure, indicative of prior usage of the logical address.

At 306, where the logical address is a relatively high-use address, the logical address is mapped to higher-endurance memory cells 206 in FIG. 2.

At 308, where the logical address is a relatively low-use address, the logical address is mapped to lower-endurance memory cells 208 in FIG. 2.

At 310, the table or other data structure may be updated to reflect that the logical address was written to at 306 or 308, as appropriate.

Processing returns to 302 to process another write request.

Figure 4:
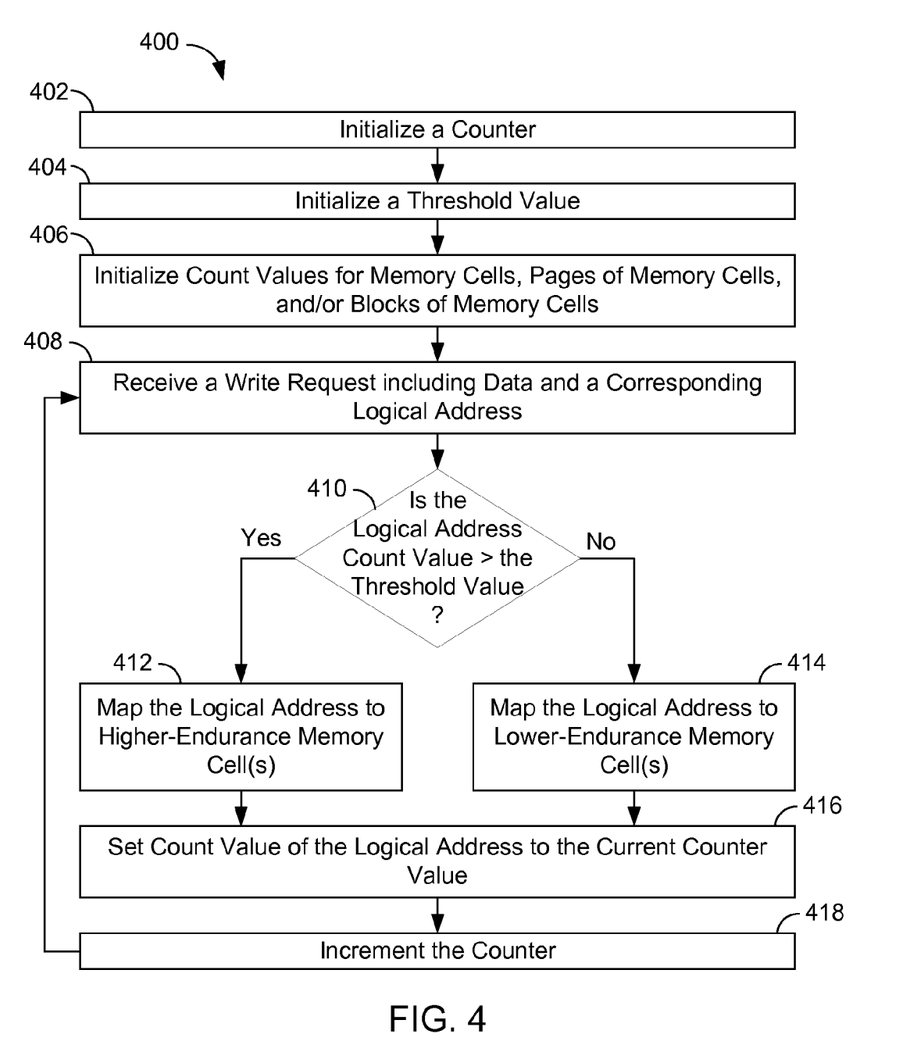
FIG. 4 is a process flowchart of an exemplary method of mapping more recently accessed addresses to higher-endurance memory cells, and less recently accessed addresses to lower-endurance memory cells.

The selective mapping at 106 may include mapping based on how recently the logical address was previously used. FIG. 4 is a process flowchart of an exemplary method 400 of mapping more recently accessed logical addresses to higher-endurance memory cells 206, and mapping less recently accessed logical addresses to lower-endurance memory cells 208.

At 402, a counter is initialized to record a number of write requests performed.

At 404, a threshold value is initialized. The initial value may be zero or greater than zero.

At 406, a table or other structure is initialized with a count value for each memory cell, page of memory cells, and/or block of memory cells. Initialization of the count values may include setting all count values to zero, or to a value greater than an initial counter value. As described below, a count value corresponding to a logical address is updated with a current value of the counter when the logical address is written to.

At 408, a write request is received, including data and a corresponding logical address.

At 410, the count value associated with the logic address is compared to the threshold.

At 412, when the count value is greater than the threshold, the logical address is mapped to higher-endurance memory cells 206.

At 414, when the count value is less than the threshold, the logical address is mapped to lower-endurance memory cells 208.

A count value that is equal to the threshold may be handled in accordance with 412 or 414.

At 416, the count value corresponding to the logical address is updated with the current count value.

At 418, the counter is incremented.

Processing may return to 408 to receive another write request.

The current counter value and the count values corresponding to logical addresses may be stored in non-volatile memory. This may be useful to preserve the values for later use when power is removed from memory system 200.

When a storage capacity of higher-endurance memory cells 206 or lower-endurance memory cells 208 is approached or reached, logical addresses or groups of logical addresses may be re-mapped between cells 206 and 208 and the threshold may be adjusted accordingly.

For example, the threshold may be initialized to a relatively low value, such as zero, to initially cause all or substantially all logical addresses to be mapped to higher-endurance memory cells 206. When the storage capacity of higher-endurance memory cells 206 is approached or reached, logical addresses may be re-mapped from higher-endurance memory cells 206 to lower-endurance memory cells 208, and the threshold may be adjusted to a value greater than zero to manage the endurances.

Figure 5:
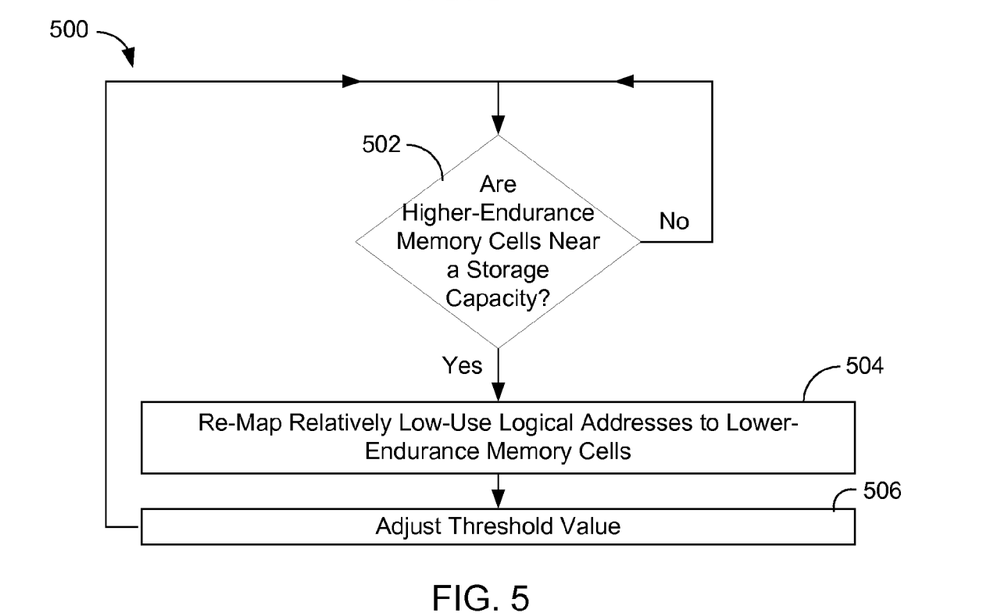
FIG. 5 is a process flowchart of an exemplary method of re-mapping addresses from higher-endurance memory cells to lower-endurance memory cells, and adjusting a threshold value.

FIG. 5 is a process flowchart of an exemplary method 500 of re-mapping logical addresses from higher-endurance memory cells 206 to lower-endurance memory cells 208, and adjusting the threshold value.

At 502, a determination is made regarding the storage capacity of higher-endurance memory cells 206.

At 504, when higher-endurance memory cells 206 are at or near a storage capacity, at least a portion of the logical addresses are re-mapped to lower-endurance memory cells 208.

The re-mapping may include remapping logical addresses having lower corresponding count values. In other words, less recently written logical addresses may be re-mapped to lower-endurance memory cells 208, while more recently written logical addresses may remain mapped to higher-endurance memory cells 206.

At 506, the threshold value is adjusted to control, restrict, or limit future writing to higher-endurance memory cells 206. The threshold value may be adjusted to the lowest count value of a logical address that remains mapped to higher-endurance memory cells 206. In such a situation, a logical address corresponding to a subsequent write operation will be mapped to higher-endurance memory cells 206 if the logical address had been written to more recently than the least recently written logical address currently mapped to higher-endurance memory cells 206. An example is graphically illustrated in FIG. 6.

Figure 6:
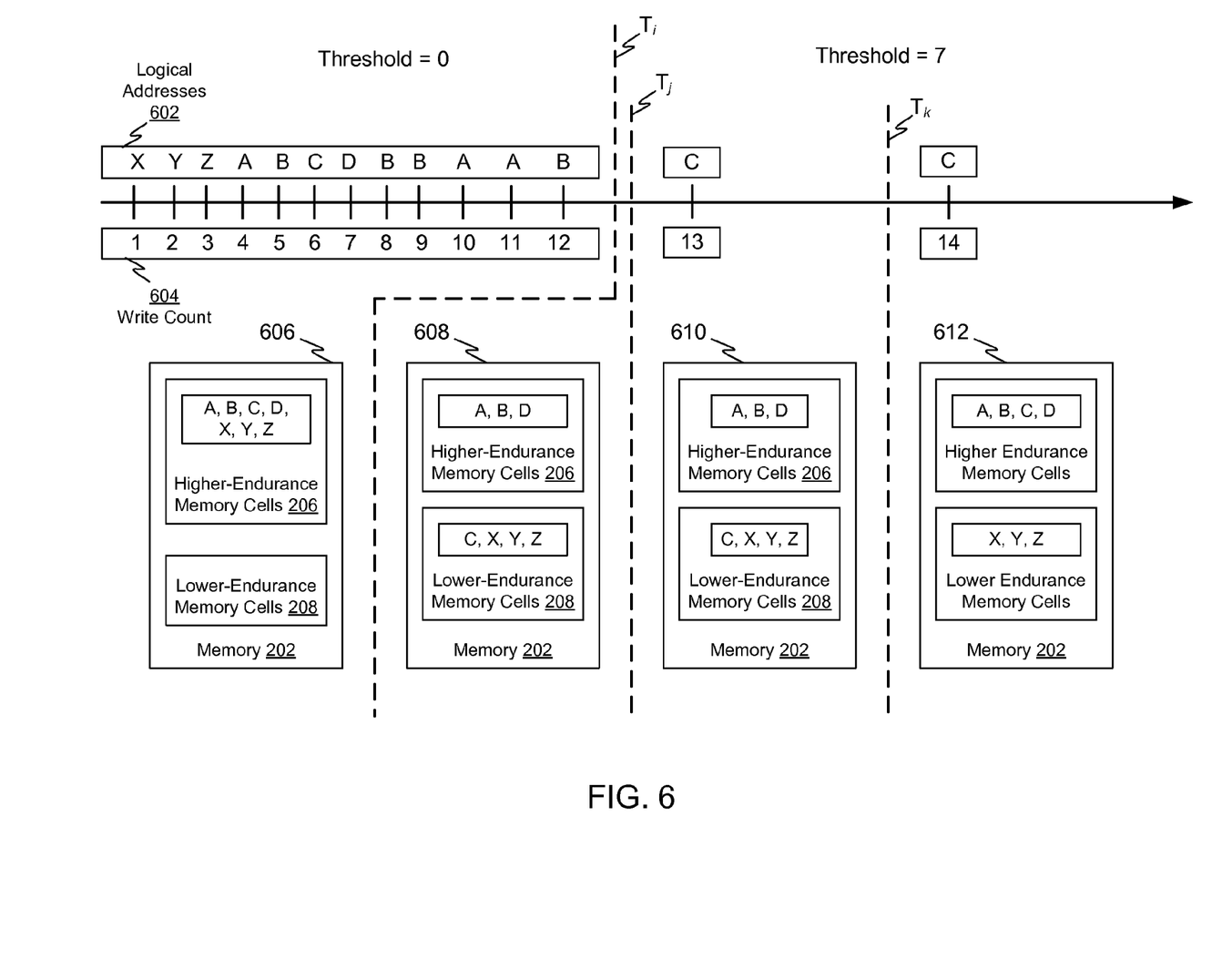
FIG. 6 is a graphic representation of an exemplary sequence of write operations and corresponding mappings and re-mappings to a hybrid flash memory system.

FIG. 6 is a graphic representation of an exemplary sequence of write operations and corresponding mappings and re-mappings to a hybrid flash memory, such as memory 202. A sequence of write operations performed with respect to logical addresses 602 correspond to write count values 604. A first write operation at write count 1 corresponds to a logical address X. A second write operation at write count 2 corresponds to a logical address Y. A third write operation at write count 3 corresponds to a logical address Z. A fourth write operation at write count 4 corresponds to a logical address A. Additional write operations at write counts 5 through 12 correspond to logical addresses B, C, D, B, B, A, A, and B, respectively.

Prior to a time $T_i$, the threshold value may be relatively low, and may be zero, and all of logical addresses 602 may be mapped to higher-endurance memory cells 206, as illustrated by an instance 606 of memory 202.

Table 1 below provides count values of the logical addresses just prior to time $T_i$.

TABLE 1

| Logical Address | Count Value |
| --- | --- |
| A | 11 |
| B | 12 |
| C | 6 |
| D | 7 |
| X | 1 |
| Y | 2 |
| Z | 3 |

At time $T_i$, logical addresses C, X, Y, and Z, having lower count values of 6, 1, 2, and 3, respectively, are re-mapped from higher-endurance memory cells 206 to lower-endurance memory cells 208, as illustrated by an instance 608 of memory 202. The re-mapping may be performed in response to a determination that higher-endurance memory cells 206 are at or near a storage capacity, as described above with respect to 502.

Logical addresses A, B, and D remain mapped to higher-endurance memory cells 206. As illustrated in Table 1 above, the lowest count value of remaining logical addresses A, B, and D, is 7, corresponding to logical address D. Accordingly, the threshold value may adjusted to a value of 7.

After a time $T_j$, logical address C is subject to another write operation, corresponding to write count 13. In Table 1 above, the count value of logical address C is 6, which is less than the threshold value of 7. In other words, logical address C was last written to before the oldest data written to higher-endurance memory cells 206. In accordance with 410 in FIG. 4, logical address C is mapped to lower-endurance memory cells 208, as illustrated by an instance 610 of memory 202.

In accordance with 416 in FIG. 4, the count value of logical address C is updated to reflect the current count value of 13, as illustrated in Table 2 below.

TABLE 2

| Logical Address | Count Value |
|---|---|
| A | 11 |
| B | 12 |
| C | 13 |
| D | 7 |
| X | 1 |
| Y | 2 |
| Z | 3 |

After a time $T_k$, logical address C is subject to another write operation, corresponding to write count 14. In Table 2 above, the count value of logical address C is 13, which is greater than the threshold value of 7. In other words, logical address C was previously written to subsequent to the oldest data in higher-endurance memory cells 206. In accordance with 410 in FIG. 4, logical address C is mapped to higher-endurance memory cells 206, as illustrated by an instance 612 of memory 202.

In accordance with 416 in FIG. 4, the count value of logical address C is updated to reflect the current count value of 14.

Count values may be associated with a group of logical addresses, which may correspond to one or more pages of memory and/or blocks of memory.

Referring back to FIG. 3, the selective mapping at 304 may include mapping more-frequently accessed logical addresses to higher-endurance memory cells 206, and mapping less frequently accessed logical addresses to lower-endurance memory cells 208.

One or more of methods 100, 300, 400, and 500, or portions thereof, may be implemented in combination with other memory management techniques, including wear leveling techniques.

One or more of methods 100, 300, 400, and 500, and flash memory system 200, or portions thereof, may be implemented in a background environment without user or operating system involvement.

One or more of methods 100, 300, 400, and 500, and flash memory system 200, or portions thereof, may be implemented with additional endurance levels and corresponding thresholds.

One or more of methods 100, 300, 400, and 500, and flash memory system 200, or portions thereof, may be implemented with logic, which may include one or more of integrated circuit logic and computer program product logic.

Figure 7:
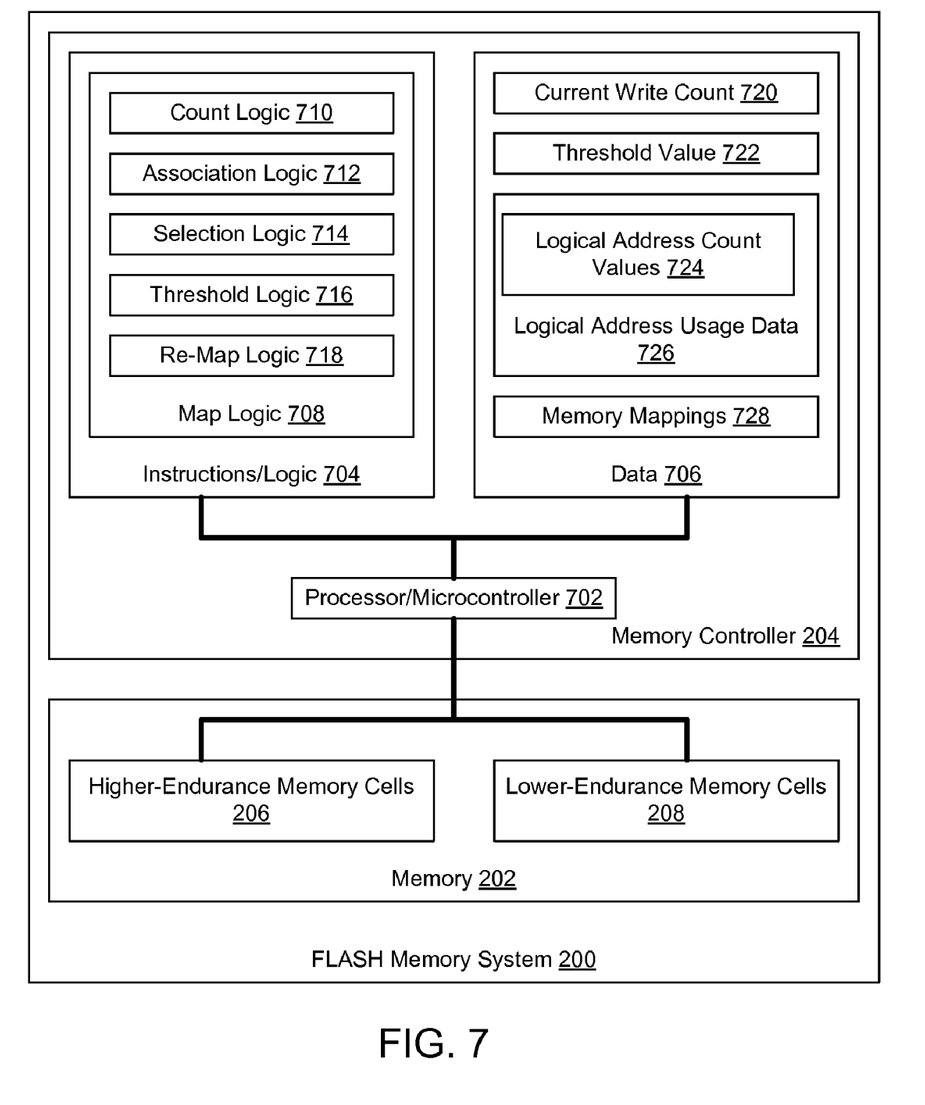
FIG. 7 is another block diagram of an exemplary hybrid flash memory system including higher-endurance memory cells and lower-endurance memory cells.

FIG. 7 is a block diagram of an exemplary embodiment of flash memory system 200, wherein memory controller 204 includes an instruction processor 702, which may include a microcontroller, to execute computer program instructions or logic 704 stored in a computer readable medium. Memory controller 204 may include data 706, which may be generated in response to logic 704.

In the example of FIG. 7, logic 704 includes map logic 708 to cause processor 702 to selectively map higher-usage logical addresses to higher-endurance memory cells 206 and lower-usage logical addresses to lower-endurance memory cells 208. Memory mappings are maintained in data 706 as memory mappings 728.

Map logic 708 may include logic to cause processor 702 to map more recently accessed logical addresses to higher-endurance memory cells 206 and less recently accessed logical addresses to lower-endurance memory cells 208.

Map logic 708 may include count logic 710 to cause processor 702 to increment a current write count 720 upon each write request.

Map logic 708 may include association logic 712 to cause processor 702 to associate a current value of current write count 720 with a logical address upon a write operation corresponding to the logical address. Count values associated with logical addresses may be maintained in data 706 as a table or other data structure, illustrated in FIG. 7 as logical address count values 724, within logical address usage data 726. Alternatively, or additionally, a portion of memory 202 may be reserved to memory controller 204, and count values associated with logical addresses may be maintained in the reserved portion of memory 202 as a table or other data structure.

Map logic 708 may include selection logic 714 to cause processor 702 to map a logical address to higher-endurance memory cells 206 when the count value associated with the logical address is greater than a threshold, and to map the logical address to lower-endurance memory cells 208 when the count value associated with the logical address is less than the threshold.

Map logic 708 may include re-map logic 718 to cause processor 702 to re-map a portion of the logical addresses from higher-endurance memory cells 206 to lower-endurance memory cells 208 when higher-endurance memory cells 206 are substantially near a storage capacity.

Map logic 708 may include threshold logic 716 to cause processor 702 to manage one or more threshold values, and may include logic to cause processor 702 to set the threshold to a lowest count value of a logical address that remains mapped to the first type of memory cells following a re-map.

Flash memory system 200 may be implemented as a solid state drive (SSD). A SSD based Flash memory system 200 may be configured to interface with a processor and/or processor circuit board (mother board) of a computer system in accordance with one or more AT Attachment (ATA) and/or AT Attachment Packet Interface (ATAPI) protocols or standards, including Serial ATA (SATA) standards and Parallel ATA (PATA) standards, such as standards and protocols promulgated by Committee T13 of the International Committee on Information Technology Standards (INCITS), (http://www.incits.org/).

A SSD based Flash memory system 200 may be configured to interface with a computer system in accordance with one or more Serial Attached Small Computer System Interface (Serial Attached SCSI, or SAS), such as standards promulgated by Committee T10 of the INCITS.

Memory controller 204, or a portion thereof, may be integrated within a computer system, such as a memory controller portion of an instruction processor system or circuit board. In such an embodiment, processor 702 may represent a processor of the computer system. Data 706, or a portion thereof, may be stored in flash memory of memory 202.

Flash memory system 200 may be implemented as an internal memory device within a housing of a computer system.

Flash memory system 200 may be implemented external of a computer system, and may be detachable and/or portable.

Flash memory system 200 may be configured to interface with a computer system in accordance with a universal serial bus (USB) protocol. Memory 202 and memory controller 204 may be packaged together, and may include a USB connector to couple to a computer system or other device. Logic 704, or a portion thereof, may be stored as firmware within the USB flash memory drive.

As noted above, endurance of a SLC may be an order of magnitude greater than a two-level cell, which may be an order of magnitude greater than a three-level cell. Conversely, MLCs may be less expensive than SLCs. A three level NAND cell may cost approximately one-third that of a two-level cell, which may cost approximately ½ that of a single-level cell. A mix of higher-endurance memory cells and lower-endurance memory cells may be selected to optimize cost and endurance.

In an exemplary embodiment, higher-endurance memory cells 206 may account for less than half of the storage capacity of memory 202, and may account for less than approximately ten percent, five percent, two percent, or less, of the storage capacity of memory 202. This may be useful, for example, where a substantial portion of write requests from a host device or host environment are directed to a relatively small number of logical addresses.

Higher-endurance memory cells 206 may include SLC NAND memory cells, and lower-endurance memory cells 208 include 3 bits-per-cell (bpc) NAND memory cells. Manufacturing costs associated with such a 1 bpc/3 bpc hybrid flash memory system may be approximately ⅔ the cost for a conventional 2 bpc NAND flash memory.

SLCs may have faster access times than MLCs. By mapping higher-usage logical addresses to SLCs, access times for the higher-usage logical addresses may be improved relative to a MLC flash memory system. Where flash memory system 200 is implemented with a relatively small amount of SLCs, improved access times for a relatively small number of higher-usage logical addresses may be obtained at a relatively low cost.

Memory system 200 may be implemented as a multi-gigabyte (GB) solid state memory system, such as 100 GB solid state memory system, and may have an endurance of approximately 5 years for an exemplary usage model.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
    first and second types of electrically erasable programmable memory cells, wherein the first type of memory cells has a greater erase-endurance than the second type of memory cells; and
    a memory controller to,
        map higher-usage logical addresses to the first type of memory cells and lower-usage logical addresses to the second type of memory cells based on a threshold measure of usage,
        re-map lower-use logical addresses from the first type of memory cells to the second type of memory cells when the first type of memory cells is near a capacity, and
        adjust the threshold measure of usage upon the re-map.

2. The system of claim 1, wherein the memory controller is implemented to:
    maintain a measure of usage for each of multiple groups of one or more logical addresses;
    map one of the groups to one of the first and second types of memory cells based on a comparison of the corresponding measure of usage and the threshold;
    update the measure of usage associated with the group based on the mapping; and
    set the threshold to a lowest measure of usage of a group that remains mapped to the first type of memory cells after the re-map.

3. The system of claim 1, wherein the memory controller is implemented to:
    initialize the threshold to a value to cause the memory controller to map all logical addresses to the first type of memory cells until the first type of memory cells is near the capacity.

4. The system of claim 1, wherein the memory controller is implemented to:
    map more frequently accessed logical addresses to the first type of memory cells and less frequently accessed logical addresses to the second type of memory cells.

5. The system of claim 1, wherein the memory controller is implemented to:
    map more recently accessed logical addresses to the first type of memory cells and less recently accessed logical addresses to the second type of memory cells.

6. The system of claim 5, wherein the memory controller includes a counter to maintain a count of write operations performed by the memory controller, and wherein the memory controller is further implemented to:
    associate a measure of usage with each of multiple groups of one or more logical addresses;
    map one of the groups to one of the first and second types of memory cells based on a comparison of the corresponding measure of usage and the threshold; and
    set the usage value of the group to a current value of the count and thereafter increment the count, after the group is mapped.

7. The system of claim 6, wherein the memory controller is further implemented to:
    set the threshold to a lowest measure of usage of a group that remains mapped to the first type of memory cells after the re-map.

8. A method of managing first and second types of electrically-erasable programmable memory cells, wherein the first type of memory cells has a greater erase-endurance than the second type of memory cells, comprising:

mapping higher-usage logical addresses to the first type of memory cells and lower-usage logical addresses to the second type of memory cells based on a threshold measure of usage;
re-mapping lower-use logical addresses from the first type of memory cells to the second type of memory cells when the first type of memory cells is near a capacity, and
adjusting the threshold measure of usage upon a re-map.

9. The method of claim 8, further including:
maintaining a measure of usage for each of multiple groups of one or more logical addresses;
wherein the mapping includes mapping one of the groups to one of the first and second types of memory cells based on a comparison of the corresponding measure of usage and the threshold, and updating the measure of usage associated with the group based on the mapping; and
wherein the adjusting of the threshold includes setting the threshold to a lowest measure of usage of a group that remains mapped to the first type of memory cells after the re-mapping.

10. The method of claim 8, further including:
initializing the threshold to a value to map all logical addresses to the first type of memory cells until the first type of memory cells is near the capacity.

11. The method of claim 8, wherein the mapping includes:
mapping more frequently accessed logical addresses to the first type of memory cells and less frequently accessed logical addresses to the second type of memory cells.

12. The method of claim 8, wherein the mapping includes:
mapping more recently accessed logical addresses to the first type of memory cells and less recently accessed logical addresses to the second type of memory cells.

13. The method of claim 12, further including:
maintaining a count of write operations;
associating a measure of usage with each of multiple groups of one or more logical addresses;
mapping one of the groups to one of the first and second types of memory cells based on a comparison of the corresponding measure of usage and the threshold; and
setting the measure of usage of the group to a current value of the count and thereafter incrementing the count, after the mapping of the group.

14. The method of claim 13, wherein the adjusting of the threshold includes:
setting the threshold to a lowest measure of usage of a group that remains mapped to the first type of memory cells after the re-mapping.

15. A non-transitory computer readable medium encoded with a computer program including instructions to cause a memory controller to manage first and second types of electrically-erasable programmable memory cells, wherein the first type of memory cells has a greater erase-endurance than the second type of memory cells, and wherein the instructions include instructions to cause the memory controller to:
map higher-usage logical addresses to the first type of memory cells and lower-usage logical addresses to the second type of memory cells based on a threshold measure of usage;
re-map lower-use logical addresses from the first type of memory cells to the second type of memory cells when the first type of memory cells is near a capacity; and
adjust the threshold measure of usage upon the re-map.

16. The computer readable medium of claim 15, further including instructions to cause the memory controller to:
maintain a measure of usage for each of multiple groups of one or more logical addresses;
map one of the groups to one of the first and second types of memory cells based on a comparison of the corresponding measure of usage and the threshold;
update the measure of usage associated with the group based on the mapping; and
set the threshold to a lowest measure of usage of a group that remains mapped to the first type of memory cells after the re-map.

17. The computer readable medium of claim 15, further including instructions to cause the memory controller to:
initialize the threshold to a value to cause the memory controller to map all logical addresses to the first type of memory cells until the first type of memory cells is near the capacity.

18. The computer readable medium of claim 15, further including instructions to cause the memory controller to:
map more frequently accessed logical addresses to the first type of memory cells and less frequently accessed logical addresses to the second type of memory cells.

19. The computer readable medium of claim 15, further including instructions to cause the memory controller to:
map more recently accessed logical addresses to the first type of memory cells and less recently accessed logical addresses to the second type of memory cells.

20. The computer readable medium of claim 19, further including instructions to cause the memory controller to:
maintain a count of write operations performed by the memory controller;
associate a measure of usage with each of multiple groups of one or more logical addresses;
map one of the groups to one of the first and second types of memory cells based on a comparison of the corresponding measure of usage and the threshold;
set the usage value of the group to a current value of the count and thereafter increment the count, after the group is mapped; and
set the threshold to a lowest measure of usage of a group that remains mapped to the first type of memory cells after the re-map.

\* \* \* \* \*